US011695374B2

United States Patent
Paladugu et al.

(10) Patent No.: US 11,695,374 B2
(45) Date of Patent: Jul. 4, 2023

(54) FAST SETTLING RIPPLE REDUCTION LOOP FOR HIGH SPEED PRECISION CHOPPER AMPLIFIERS

(71) Applicant: NXP B.V., Eindhoven (NL)

(72) Inventors: Ranga Seshu Paladugu, Milpitas, CA (US); Hanqing Xing, Sunnyvale, CA (US); Soon G Lim, San Jose, CA (US)

(73) Assignee: NXP B.V., Eindhoven (NL)

( * ) Notice: Subject to any disclaimer, the term of this patent is extended or adjusted under 35 U.S.C. 154(b) by 198 days.

(21) Appl. No.: 17/152,872

(22) Filed: Jan. 20, 2021

(65) Prior Publication Data

US 2022/0231639 A1    Jul. 21, 2022

(51) Int. Cl.
*H03F 1/26* (2006.01)
*H03F 3/387* (2006.01)
*H03F 3/45* (2006.01)

(52) U.S. Cl.
CPC .............. *H03F 1/26* (2013.01); *H03F 3/387* (2013.01); *H03F 3/45968* (2013.01); *H03F 2200/271* (2013.01); *H03F 2200/459* (2013.01)

(58) Field of Classification Search
CPC ........ H03F 1/26; H03F 3/387; H03F 3/45968; H03F 3/45475; H03F 2200/271; H03F 2200/459
USPC ............................................. 330/9, 253, 254
See application file for complete search history.

(56) References Cited

U.S. PATENT DOCUMENTS

| 7,764,118 | B2 | 7/2010 | Kusuda et al. |
| 9,564,859 | B2 | 2/2017 | Ivanov et al. |
| 9,614,481 | B2* | 4/2017 | Ivanov ................ H03F 3/45183 |
| 9,973,161 | B2 | 5/2018 | Ivanov et al. |

OTHER PUBLICATIONS

Ivanov et al., "A 10MHz-Bandwidth 4us-Large-Signal-Settling 6.5nV/Hz-Noise 2uV-Offset Chopper Operational Amplifier," 2016 IEEE International Solid-State Circuits Conference, Feb. 1, 2016, pp. 88-90; 3 pages.

* cited by examiner

*Primary Examiner* — Hafizur Rahman
*Assistant Examiner* — Khiem D Nguyen

(57) ABSTRACT

A method for a fast settling ripple reduction loop for high speed precision chopper amplifiers includes amplifying an input signal with a signal path to generate a first output, the signal path comprising chopping the input signal to generate a first chopper output, amplifying the first chopper output with an amplifier to generate an amplifier output and chopping the amplified output to generate a second chopper output. An output ripple of the first output is reduced with a Ripple Reduction Loop comprising chopping the second chopper output to generate a third chopper output, filtering the third chopper output with a filter to generate a Direct Current (DC) offset correction, and combining the DC offset correction with the amplifier output, wherein the third chopper output is driven to the output voltage of the filter and the RRL is disconnected from the low frequency signal path in response to a non-linear event.

17 Claims, 7 Drawing Sheets

FAST SETTLING RIPPLE REDUCTION LOOP FOR HIGH SPEED PRECISION CHOPPER AMPLIFIERS

FIELD

This disclosure relates generally to amplifiers, and more specifically to chopper amplifiers with fast settling ripple reduction.

BACKGROUND

Chopper amplifiers contain a signal path for amplifying high frequency signals and a second parallel path with a high gain and chopper switches for low frequency signals. In various examples of a chopper amplifier, the second parallel path uses a first chopper to modulate the input signal, thereby converting the input signal to an Alternative Current (AC) signal. The AC signal is then amplified with an amplifier and converted back to a DC signal with a second chopper, demodulating the amplified AC signal. Accordingly, low offset error and drift, and a reduction in 1/f noise is achieved.

One drawback of a chopper amplifier is the presence of voltage ripple at the final output. The fundamental frequency of this voltage ripple noise occurs at the chopper frequency, with tones at the multiples of the chopper frequency. This output ripple at the chopping frequency, if not reduced, undermines the accuracy of the overall system. To suppress this output ripple, various ripple reduction techniques are used.

For superior output voltage ripple suppression in chopper amplifier systems, a ripple reduction loop (RRL) circuit is often used inside the main chopper amplifier. One problem associated with the use of a ripple reduction loop (RRL) is a very slow transient settling performance limiting the overall chopper amplifier settling performance.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Various embodiments described herein provide for reducing the settling time of an RRL loop to improve the overall settling performance of a chopper amplifier system. Specifically, the RRL is put into a particular state in response to an amplifier non-linear operational event such as an input multiplexer switching which can present a step to the input of an amplifier circuit or an excessive slew rate limiting input transient to the amplifier circuit, so that the chopper amplifier system recovers faster and thus reduces the settling time of the system. To ensure loop stability, the bandwidth of the RRL, or a similar ripple attenuation filter, should be lowered with respect to the chopping frequency of the chopper circuits used in the chopper amplifier system. In one example embodiment, the chopping frequency is 10 to 1000 times lower than a bandwidth of the amplifier circuit. An upper limit of the chopper frequency is established to limit higher switching input current. During the non-linear event as mentioned above, the capacitors within the RRL used to integrate and hold voltages for ripple suppression, can deviate significantly from their steady state values. When the chopper amplifier system resumes linear operation, the low bandwidth of the RRL results in very slow recovery of the resulting errors on the internal capacitor nodes, and thus degrades the transient settling performance of the RRL, and consequently the overall chopper amplifier system. Detection of the non-linear events, temporary suspension of the RRL, and precisely driving the RRL integrator and hold capacitor voltages to a state preceding the non-linear event, results in much quicker recovery of the chopper amplifier system.

Figure 1:
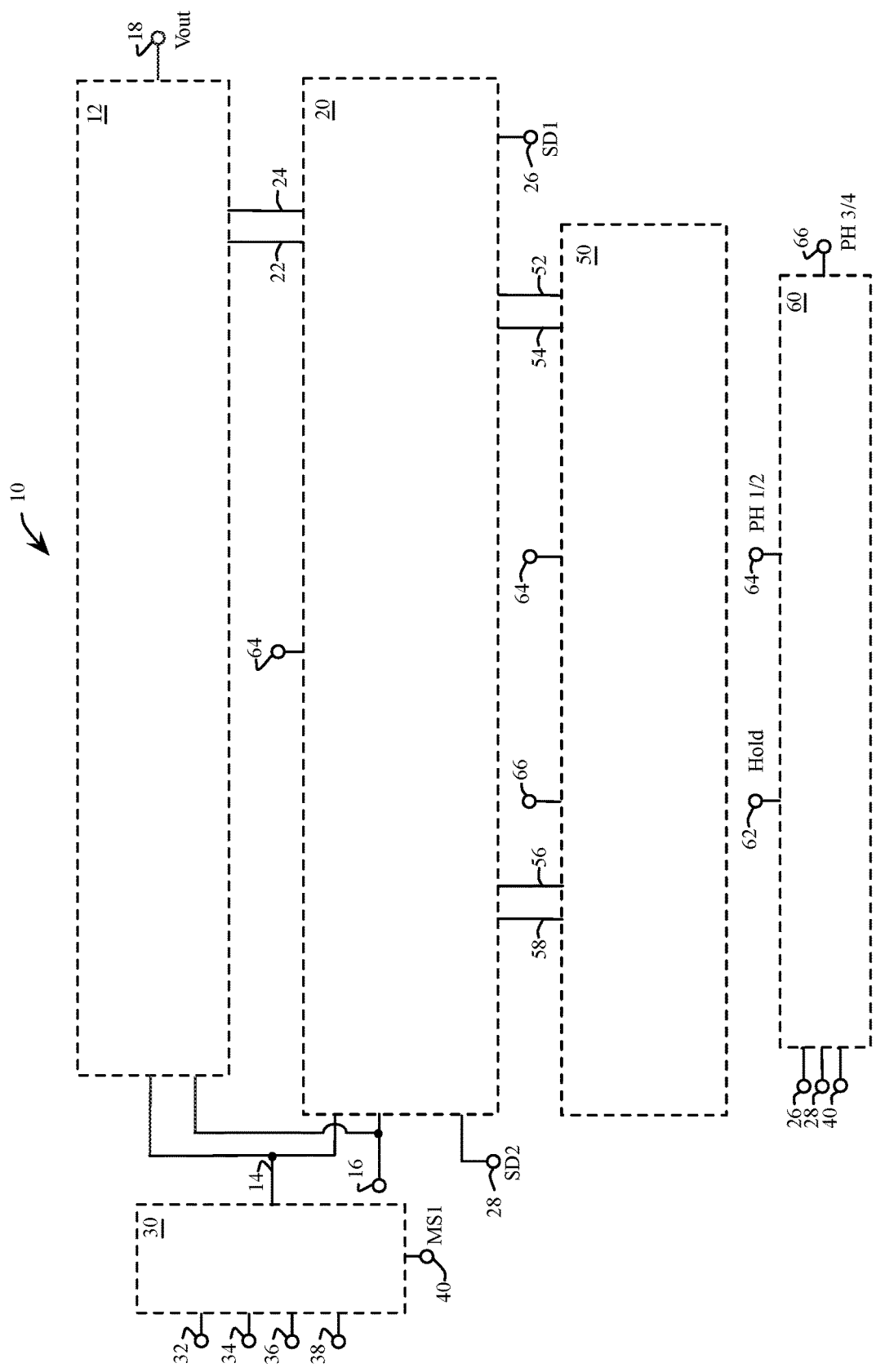
FIG. 1 is a schematic view of the functional blocks of a fast settling ripple reduction loop for high speed precision chopper amplifiers, in accordance with an example embodiment of the present disclosure.

FIG. 1 shows an example embodiment 10 of a high speed precision chopper amplifier. The embodiment 10, includes a high frequency signal path 12 configured to amplify a differential input signal comprising a positive input 14 and a negative input 16, (generally "input signal"), to generate a system output 18. The low frequency signal path 20 combines a differential output of the high frequency path 12 with a differential output of the low frequency signal path 20 at a first positive node 22 and a first negative node 24. The differential voltage at nodes 22 and 24 is further amplified to generate the system output 18. A first slew detect (SD1) 26 and a second slew detect (SD2) 28 are present within the low frequency signal path to indicate the presence of a non-linear operational event within the embodiment 10 of the chopper amplifier, as indicated by a high slew rate. In one embodiment, the SD1 26 and the SD2 28 detect a high slew rate by comparing a resulting voltage differential exceeding a threshold, by using a window comparator. SD1 26 detects a high slew rate after further signal operations (e.g., chopping and amplification), compared to SD1 28. Hence, SD1 26 detects additional contributions to the non-linear event, while SD2 28 detects non-linearity with less delay than SD1 26.

In one example embodiment, a multiplexer circuit 30 multiplexes a plurality of inputs 32, 34, 36 and 38, in response to a multiplexer address (MS1) 40, to generate the positive input signal 14. In one embodiment, the MS1 40 includes two select bits. The example embodiment 10 further includes an RRL 50 to reduce voltage ripples on the system output 18 introduced by the chopping operations. An output ripple of the embodiment 10 is substantially reduced by receiving by the RRL 50, a differential pair of signals 52 and 54 corresponding to the input signal modulated, amplified and then demodulated to DC, and the DC offset of the first amplifier circuit is amplified and modulated to an AC amplifier offset. The differential pair of signals 52 and 54 are chopped to modulate the input signal to an AC signal, and to demodulate the AC amplifier offset to the DC offset. The AC signal component is then filtered out by a filter circuit. The remaining signal is a DC offset that is inverted and combined with the output of the first amplifier circuit at nodes 56 and 58 nullifying the DC offset of the first amplifier circuit and thus reducing the voltage ripple on the system output 18.

A timing circuit 60 receives one or more of the MS1 40, SD1 26 and SD2 28 to generate a Hold signal 62. The Hold signal 62 is active when a non-linear condition is detected from one or more of the MS1 40, SD1 26 and SD2 28. When the Hold signal 62 is activated, the RRL 50 is decoupled from the low frequency signal path 20 and the input and output voltages of the filter circuit within the RRL 50 are driven to the same voltage to facilitate quick recovery of the filter circuit once the non-linear event has passed. The Hold signal 62 further pauses or holds the clock (PH 1/2) 64 at its current state, which includes a first and second phase. A clock with a 90-degree phase shift (PH 3/4 66 is derived from the PH 1/2 clock 64, and thus is also pause or held with the Hold signal 62. In one embodiment, the PH 1/2 clock 64 is used by both the low frequency signal path 20 and the RRL 50, and the PH 3/4 clock 66 is used by the RRL 50.

Figure 2:
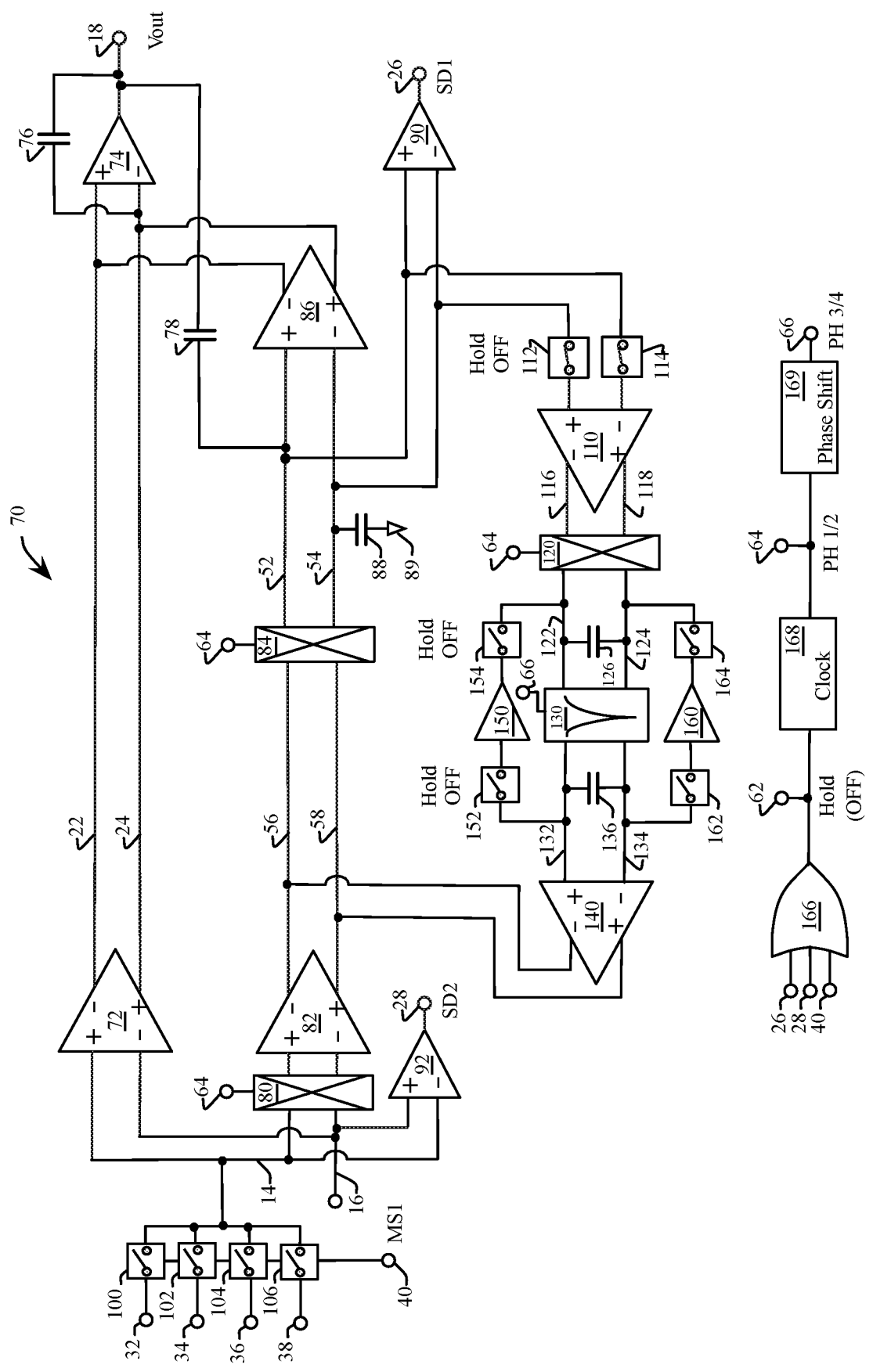
FIG. 2 is a schematic view of a fast settling ripple reduction loop for high speed precision chopper amplifiers operating in a normal mode, in accordance with an example embodiment of the present disclosure.

FIG. 2, with continued reference to FIG. 1 shows a schematic view of an example embodiment 70 of a high speed precision chopper amplifier in a normal operating mode. The high frequency signal path 12 of the embodiment 70 includes a first transconductance amplifier circuit 72 configured to amplify the positive input 14 and the negative input 16 into the differential signal formed at nodes 22 and 24 respectively. A second transconductance amplifier circuit 74 amplifies the differential signal formed at nodes 22 and 24 to form the system output 18. In one embodiment, the second transconductance amplifier circuit 74 further includes a first compensation capacitor 76 (e.g., a Miller capacitor), between the system output 18 and the node 24, and a second compensation capacitor 78 between the system output 18 and the node 52.

The low frequency signal path 20 includes a first chopper circuit 80, clocked by the PH 1/2 clock 64. A chopper circuit modulates the input signal with a clock (e.g., PH 1/2 clock 64), to convert a DC or low-frequency signal to an AC or high-frequency signal. Chopping again, a previously chopped signal, effectively demodulates the chopped signal by creating a harmonic of the original DC signal at close to zero Hertz. An AC output of the first chopper circuit 80 is amplified by a third transconductance amplifier circuit 82 to generate the differential pair of signals 56 and 58 representing an amplified AC version of the input signals 14 and 16 and an amplified DC offset introduced by the third amplifier circuit 82. The signals 56 and 58 are further chopped by a second chopper circuit 84, clocked by the PH 1/2 clock 64 to generate a demodulated differential input signal on the nodes 52 and 54 at DC and a modulated AC amplifier offset from the amplifier circuit 82. The differential signal on the nodes 52 and 54 are buffered by a fourth transconductance amplifier circuit 86 and combined with the output of the first amplifier circuit 72 on nodes 22 and 24 respectively. In one embodiment, a capacitor 88 is included between node 54 and a ground 89 to provide capacitive loading balance on a differential path. In one embodiment, the gains of each of the third transconductance amplifier circuit 82 and the fourth transconductance amplifier circuit 86 are greater than a gain of the first transconductance amplifier circuit 72, thereby minimizing offset errors due to the first transconductance amplifier circuit 72.

The SD1 26 is generated from a comparator 90 receiving inputs from nodes 52 and 54. In one embodiment, the comparator 90 is a window comparator circuit, which detects a high slew rate by comparing a voltage difference between nodes 52 and 54 against a threshold. The SD2 28 is generated from a comparator circuit 92 receiving inputs from the input signals 14 and 16. In one embodiment, the comparator circuit 92 is a window comparator circuit, which compares a voltage difference between input signals 14 and 16 against a threshold. The multiplexer circuit 30 includes a plurality of switches 100, 102, 104 and 106, with one of the switches selected by the MS1 40 to connect a respective one of the inputs 32, 34, 36 and 38 to the positive input 14.

The RRL 50 effectively detects and removes the output ripple on the system output 18 resulting from the AC (or modulated) offset from the third amplifier circuit 82. Specifically, the RRL 50 includes a pair of switches 112 and 114 to decouple the RRL 50 from the low frequency signal path 20 when the Hold signal 62 is active. A fifth transconductance amplifier circuit 110 receives and amplifies the DC input signal and the AC amplifier offset from nodes 52 and 54 through switches 112 and 114. A third chopper circuit 120, modulates the DC input signal into an AC input signal at the chopping frequency, and demodulates the AC amplifier offset into a DC offset. The resulting AC input frequency and DC offset are integrated onto an integration capacitor 126 between nodes 122 and 124. In one embodiment, the integration capacitor 126 is formed by a network of capacitors.

A filter circuit 130, clocked by PH 3/4 66, filters out the AC input frequency and holds the DC offset value on a hold capacitor 136 between nodes 132 and 134. In one embodiment, the filter circuit 130 is a notch filter. In another embodiment, the filter circuit 130 is a low pass filter. In one embodiment, the hold capacitor 136 is formed by a network of capacitors. A sixth transconductance amplifier circuit 140 amplifies the voltage across the hold capacitor 136 and generates a signal on nodes 56 and 58 to nullify the amplified DC offset from the amplifier circuit 82, thereby substantially reducing or eliminating the resulting voltage ripple at the system output 18. In the normal mode of operation, when there is no nonlinearity in the amplifier circuit due to slewing or input multiplexer switching, the switches 112 and 114 are closed, thereby connecting the RLL 50 to the low frequency signal path 20. Additionally, a switchable buffer circuit 150 connectable between the output 132 of the filter circuit 130 and the input 122 of the filter circuit 130 through switches 152 and 154 remains in a disconnected state. Similarly, a switchable buffer circuit 160 connectable between an output 134 of the filter circuit 130 and the input 124 of the filter circuit 130 through switches 162 and 164 remains in a disconnected state. In one embodiment, the switchable buffer circuits 150 and 160 are low offset buffers. In another embodiment, the switchable buffer circuits 150 and 160 comprise switches configured to autozero each respective buffer using two different clock phases and by connecting the respective outputs of each buffer circuit to the respective inputs of each buffer circuit in one of the phases. In one embodiment, the switches 152, 154, 162 and 164 are opened, the system's clock resumes again and the switches 112 and 114 are closed after a short delay from when the Hold signal 62 becomes inactive.

A timing circuit 60 includes an OR function, 166 shown symbolically as an OR gate circuit to generate the Hold signal 62 from one or more of the SD1 26, SD2 28 and MS1 40. In example embodiments, the OR function is implemented with a variety of circuitry known in the art. The Hold signal 62 gates a chopping clock 168 used to clock the first chopper circuit 80, the second chopper circuit 84 and the third chopper circuit 120. The chopping clock 168 is further phase shifted by 90 degrees to form a phase shifted clock 169 with a PH 3/4 output 66.

Figure 3:
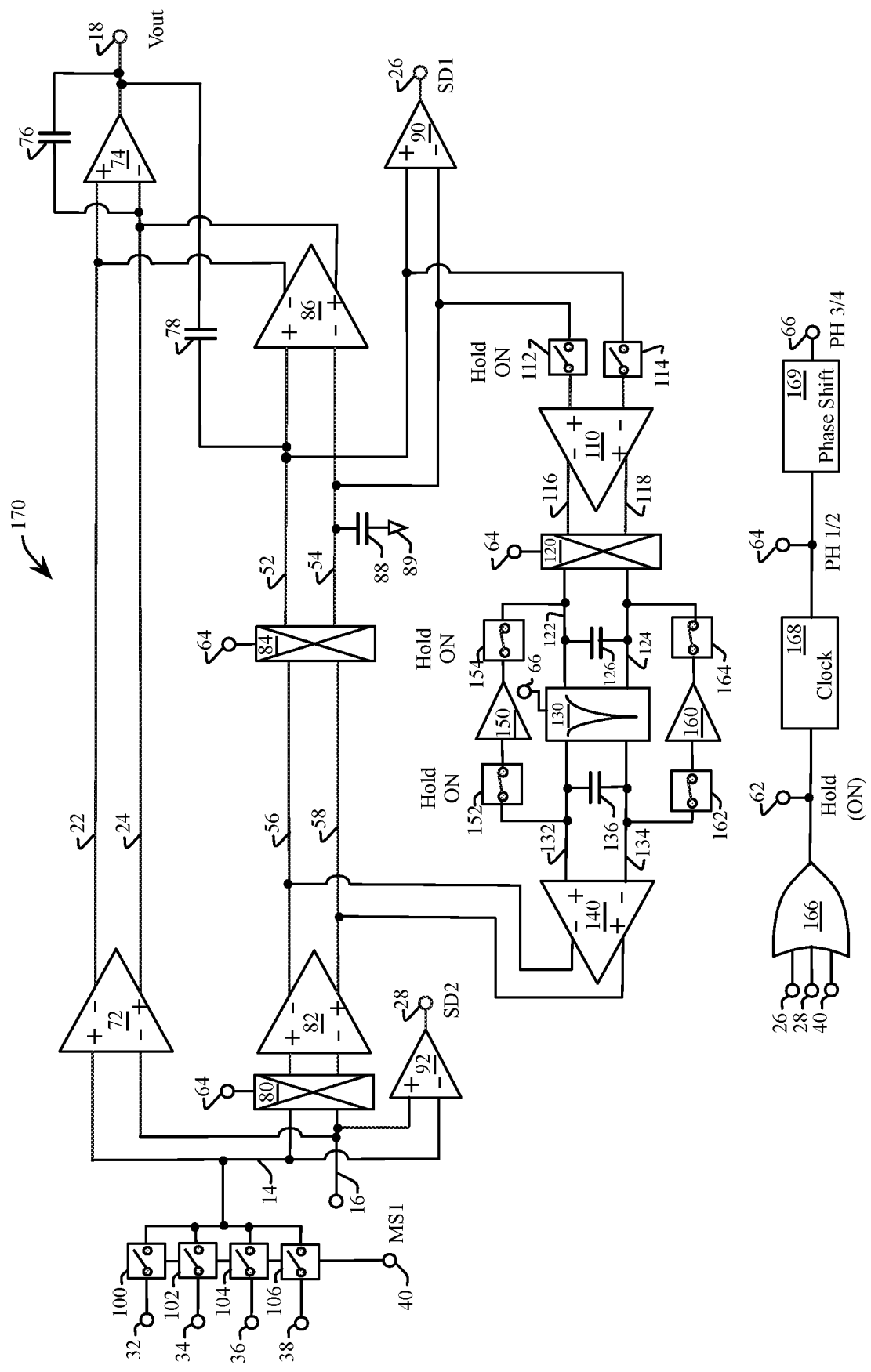
FIG. 3 is a schematic view of the functional blocks of a fast settling ripple reduction loop for high speed precision chopper amplifiers operating in a Hold mode, in accordance with an example embodiment of the present disclosure.

FIG. 3, with continued reference to FIG. 1 and FIG. 2 shows a schematic view of an example embodiment 170 of a high speed precision chopper amplifier in the Hold mode. In the embodiment 170, the integration nodes 122 and 124 are driven to respective output voltages of the filter circuit 130 at nodes 132 and 134 by switchable buffer circuits 150 and 160. Specifically, the switchable buffer circuits 150 and 160 are connected across the filter circuit 130 by closing switches 152, 154, 162 and 164 in response to the Hold signal 62 becoming active (e.g., a high state in one embodiment). Concurrently, the RRL 50 is disconnected from the low frequency signal path 20 by opening switches 112 and 114.

Figure 4:
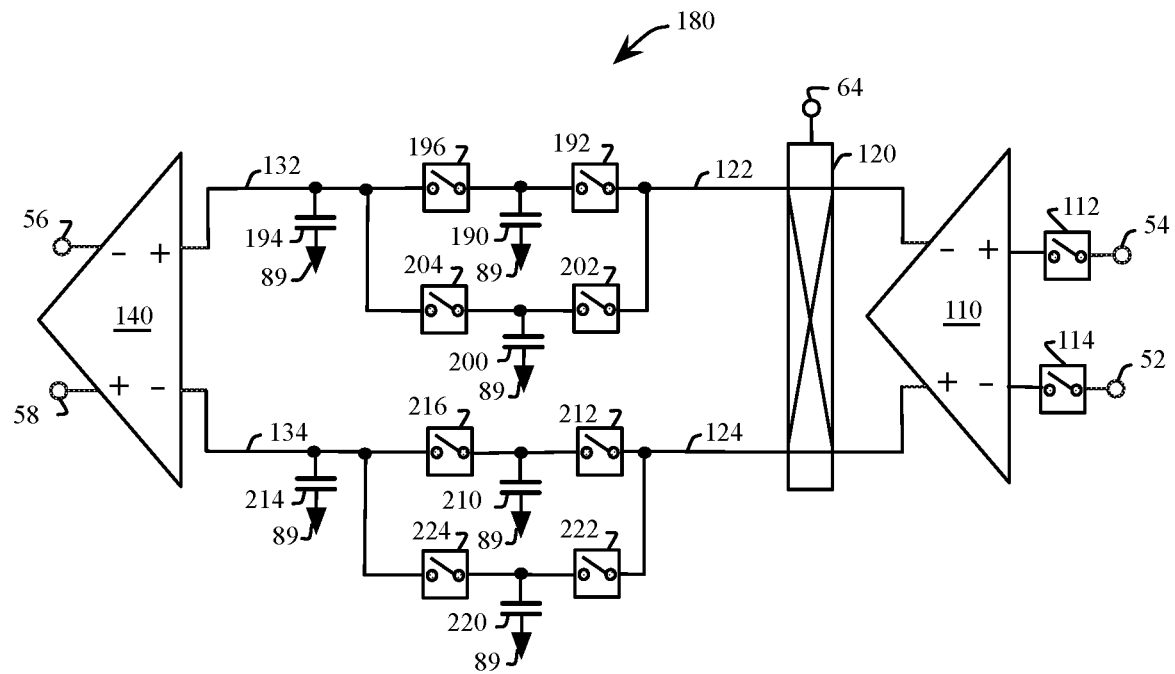
FIG. 4 is a schematic view of the notch filter of FIG. 2 and FIG. 3, in accordance with an example embodiment of the present disclosure.

FIG. 4 shows a schematic view of an example embodiment 180 of the RRL 50 with specific detail of one embodiment of the filter circuit 130 based on a switched capacitor implementation. The representative integration capacitor 126 of FIG. 3 is implemented with capacitors 190, 200, 210 and 220. The representative hold capacitor 136 of FIG. 3 is implemented with capacitors 194 and 214. During phase 3 of clock PH 3/4 66, the switches 192, 204, 212 and 224 are closed and the switches 196, 202, 216 and 222 are opened. During phase 4 of clock PH 3/4 66, the switches 196, 202, 216 and 222 are closed and the switches 192, 204, 212 and 224 are opened. As further shown in the timing diagram of FIG. 5, the transfer of charge to the integration capacitors 190, 200, 210 and 220, and subsequently to the hold capacitors 194 and 214 occurs at a transition of the PH 3/4 clock 66. The timing diagram of FIG. 5 shows a filter input voltage 230 at node 122 and a filter output voltage 232 at node 132.

The bandwidth of the RRL 50 is determined by the cut-off frequency of the notch filter 130 (or a low pass filter), which in turn is dependent on the chopping frequency (e.g. the frequency of the PH 3/4 clock 66). A large phase shift occurs at the notch frequency (e.g., centered at the chopping frequency), hence the RRL 50 bandwidth is designed to be much lower than the chopping frequency for loop stability. In one embodiment, the RRL 50 bandwidth is 5-100 times lower than the chopper amplifier system 70 bandwidth, thus the RRL 50 limits the overall settling performance of the system 70. During a non-linear event, the voltages of the integration capacitor 126 and hold capacitor 136 deviates significantly from their steady state operating values. When the system 70 exits from the non-linear event, the low bandwidth of the RRL 50 would result in a slow recovery and thus slow down the transient response of the system 70, if not for the implementation of the teachings of this disclosure.

Figure 5:
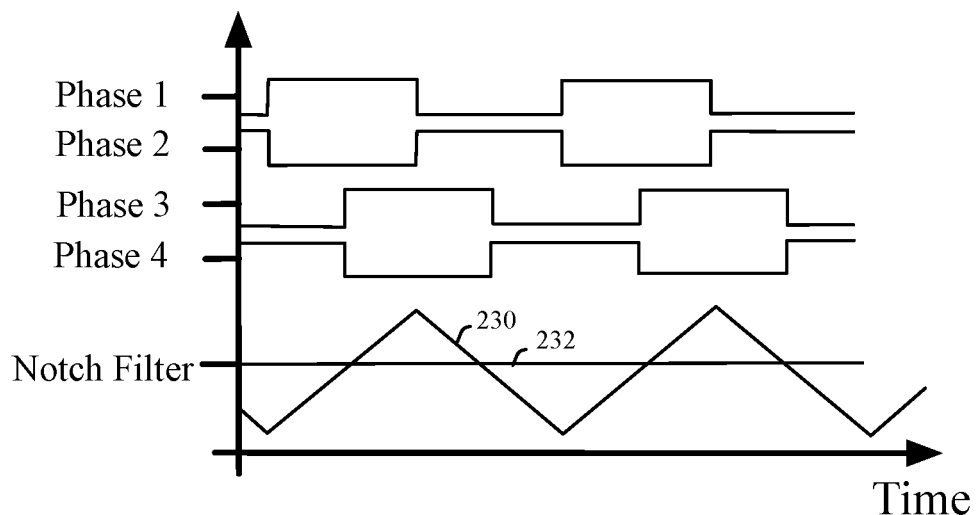
FIG. 5 is a graphical view of a timing diagram for an operation of the notch filter of FIG. 4, in accordance with an example embodiment of the present disclosure.

As shown in FIG. 5, during the steady state operation of FIG. 2, the voltages on the integration nodes 122 and 124 and the respective hold capacitor nodes 132 and 134 are equal during the transitions of the PH 3/4 clock 66, when charge transfer takes place. Hence in one embodiment, the transition from the Hold state, where the Hold signal 62 is active, to normal operation occurs at the PH 3/4 clock 66 transition. In one embodiment, the RRL 50 is reconnected to the low frequency signal path 20, before the Hold state transition, to provide time for the amplifier circuit 110 to settle any small disturbance at the inputs to the amplifier circuit 110, prior to opening the switches 152, 154, 162 and 164.

Figure 6:
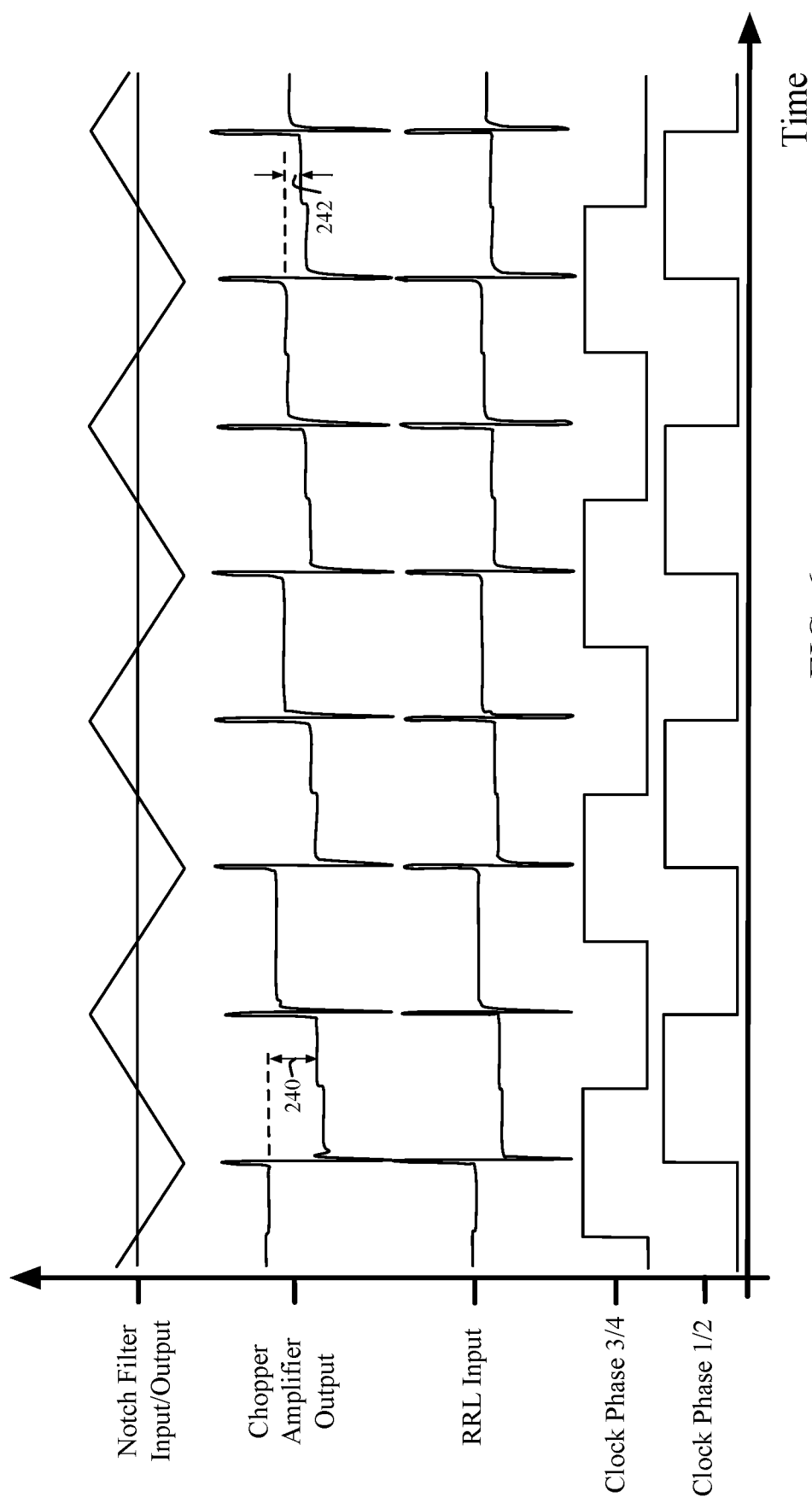
FIG. 6 is a graphical view of the timing of several internal nodes of the chopper amplifier of FIG. 3 in the normal mode, in accordance with an example embodiment of the present disclosure.

FIG. 6 shows a graphical view of the internal nodes of an embodiment of a high speed precision chopper amplifier during RRL transient settling. With reference to embodiment 70 of FIG. 2, the notch filter input/output corresponds to node 132, the chopper amplifier output corresponds to the system output 18, the RRL input corresponds to node 54, the clock phase 3/4 corresponds to PH 3/4 clock 66 and the clock phase 1/2 corresponds to PH 1/2 clock 64. As can be seen from FIG. 6, the chopper amplifier output ripple sequentially improves from magnitude 240, to a smaller magnitude 242 and eventually trending to very low magnitude ripple.

Figure 7:
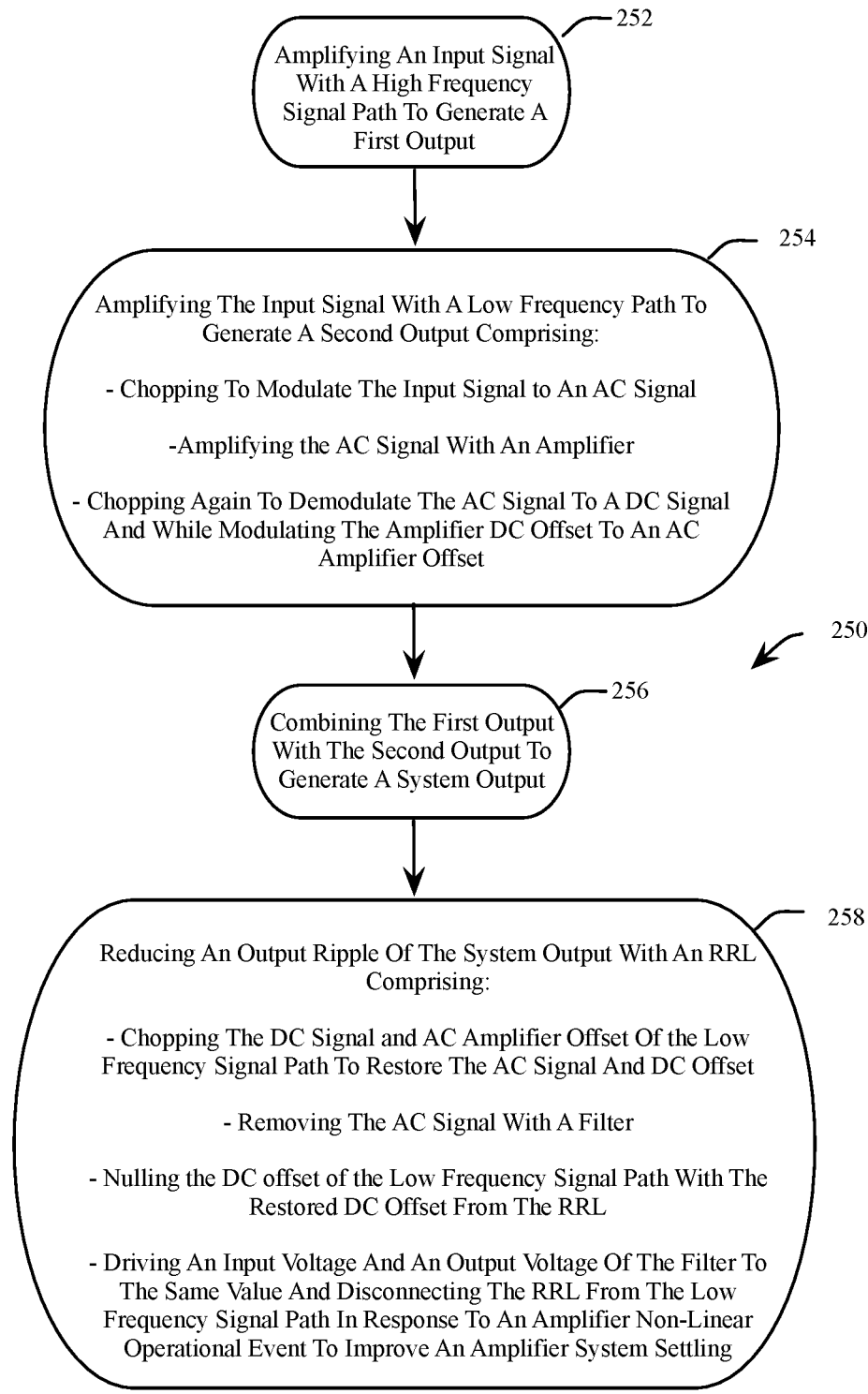
FIG. 7 is a flowchart representation of a method for a fast settling ripple reduction loop for high speed precision chopper amplifiers, in accordance with an example embodiment of the present disclosure.

FIG. 7 shows an example embodiment 250 of a method for a fast settling ripple reduction loop for high speed precision chopper amplifiers. With reference to FIG. 7 and FIG. 2, at 252, an input signal 14 and 16 is amplified with a high frequency signal path 12 to generate a first output 22 and 24. At 254, the input signal 14 and 16 is amplified with a low frequency path 20 to generate a second output 52 and 54. The input signal is chopped (with the first chopper circuit 80) to modulate the input signal 14 and 16 into an AC signal. The AC signal is amplified with an amplifier circuit 82. The AC signal is chopped (with the second chopper circuit 84) to a DC signal, and to modulate the DC offset of the amplifier circuit 82 to generate an AC amplifier offset. At 256, the first output 22 and 24 is combined with the second output 52 and 54 (after buffering with the fourth amplifier circuit 86) to generate a system output 18. At 258, an output ripple of the system output 18 is reduced with an RRL 50. The DC signal and AC amplifier offset (at nodes 52 and 54) of the low frequency signal path 20 is chopped (with the third chopper circuit 120) to restore the AC signal and DC offset. The AC signal (the input modulated to the chopper frequency) is removed with a filter 130. The DC offset of the third amplifier circuit 82 of the low frequency signal path 20 is nulled with the restored DC offset from the RRL 50 (as output by the sixth amplifier circuit 140). During an amplifier non-linear operation like input multiplexer switching or slewing, the input voltage (at nodes 122 and 124) and the output voltage (at nodes 132 and 134) of the filter circuit 130 is driven to a same value (e.g., voltage prior to the non-linear event). The RRL 50 is disconnected from the low frequency signal path 20 in response to a non-linear event (e.g., when the Hold signal 62 is activated).

Figure 8:
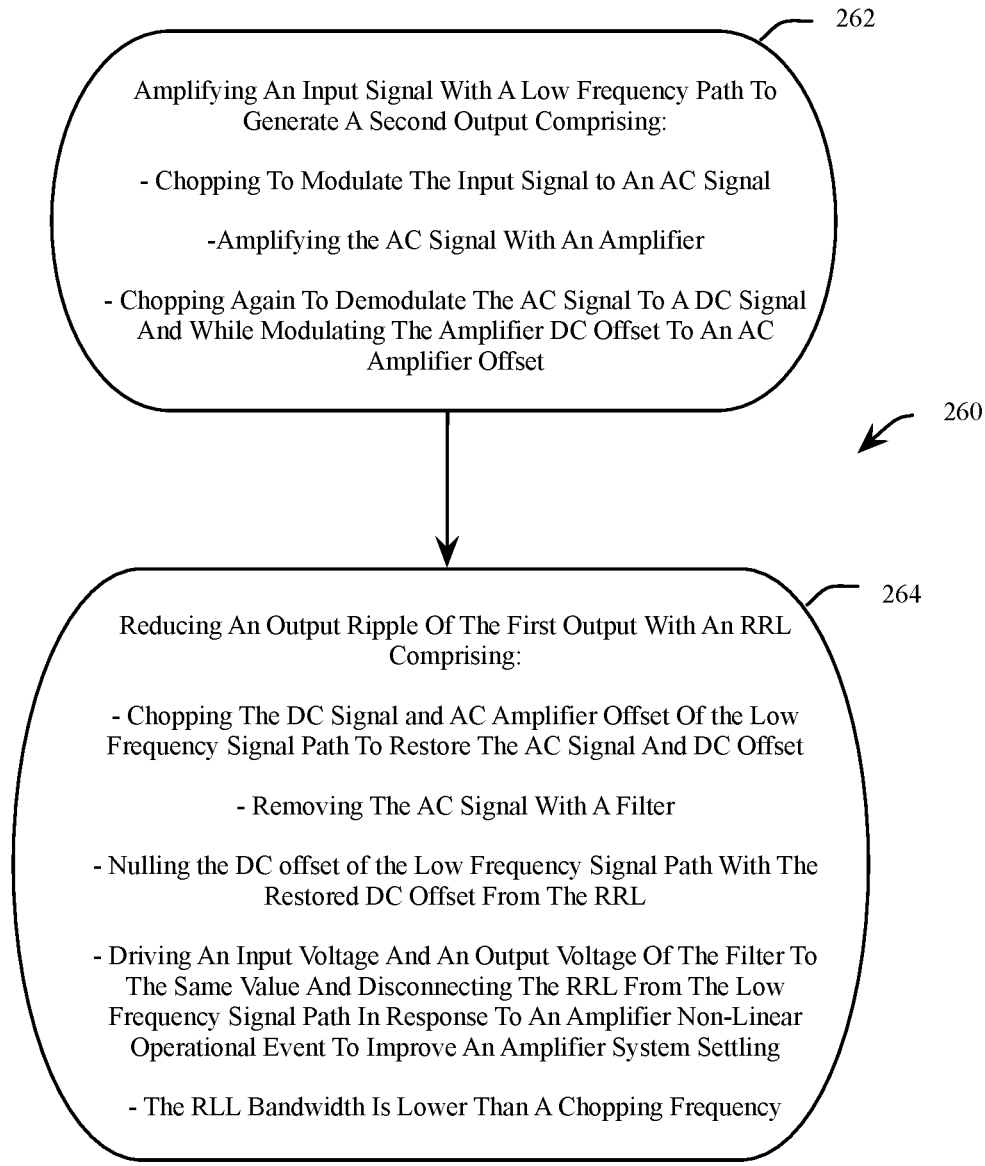
FIG. 8 is a flowchart representation of another method for a fast settling ripple reduction loop for high speed precision chopper amplifiers, in accordance with an example embodiment of the present disclosure.

FIG. 8 shows an example embodiment 260 of a method for a fast settling ripple reduction loop for high speed precision chopper amplifiers. With reference to FIG. 8 and FIG. 2, at 262, an input signal 14 and 16 is amplified with a low frequency path 20 to generate a second output 52 and 54. The input signal is chopped (with the first chopper circuit 80) to modulate the input signal 14 and 16 into an AC signal. The AC signal is amplified with an amplifier circuit 82. The AC signal is chopped (with the second chopper circuit 84) to a DC signal, and to modulate the DC offset of the amplifier circuit 82 to generate an AC amplifier offset.

At 264, an output ripple of the first output 22 and 24 is reduced with an RRL 50. The DC signal and AC amplifier offset (at nodes 52 and 54) of the low frequency signal path 20 is chopped (with the third chopper circuit 120) to restore the AC signal and DC offset. The AC signal (the input modulated to the chopper frequency) is removed with a filter circuit 130. The DC offset (from the third amplifier circuit 82) of the low frequency signal path 20 is nulled with the restored DC offset from the RRL 50, (as output by the sixth amplifier circuit 140). An input voltage (at nodes 122 and 124) and an output voltage (at nodes 132 and 134) of the filter circuit 130 is driven to a same value (e.g., voltage prior to the non-linear event). The RRL 50 is disconnected from the low frequency signal path 20 in response to a non-linear event (e.g., when the Hold signal 62 is activated). The RLL bandwidth is lower than a chopping frequency (e.g., the frequency of the PH 1/2 clock 64 used by the chopper circuits 80, 84 and 120).

As will be appreciated, embodiments as disclosed include at least the following. In one embodiment, a method for a fast settling ripple reduction loop for high speed precision chopper amplifiers comprises amplifying an input signal with a high frequency signal path to generate a first output. The input signal is amplified with a low frequency signal path to generate a second output, the low frequency signal path comprising chopping the input signal to generate a first chopper output, amplifying the first chopper output with an amplifier circuit to generate an amplifier output and chopping the amplified output to generate a second chopper output. The first output is combined with the second output to generate a system output. An output ripple of the system output is reduced with a Ripple Reduction Loop (RRL) comprising chopping the second chopper output to generate a third chopper output, filtering the third chopper output with a filter circuit to generate a Direct Current (DC) offset correction, and combining the DC offset correction with the amplifier output, wherein the third chopper output is driven to an output voltage of the filter circuit and the RRL is disconnected from the low frequency signal path in response to a non-linear operational event.

Alternative embodiments of the method for a fast settling ripple reduction loop for high speed precision chopper amplifiers include one of the following features, or any combination thereof. A first chopper circuit modulates the input signal to generate an Alternating Current (AC) input signal, a second chopper circuit demodulates the AC input signal to generate a DC input signal and the second chopper circuit modulates a DC offset of the amplifier circuit to generate an AC amplifier offset. A plurality of inputs is multiplexed with a multiplexer circuit to form the input signal. The non-linear operational event comprises detecting a transition of a multiplexer address of a multiplexer circuit, wherein the multiplexer address selects one of the plurality of inputs. The non-linear operational event comprises detecting a high input signal slew rate from a differential voltage exceeding a threshold. The high input signal slew rate is determined from a pair of signals comprising one of the input signal and the second chopper output. Detecting the slew rate comprises comparing the differential voltage with a window comparator circuit. The RRL comprises a lower bandwidth than a chopping frequency of a first chopper circuit. A buffer circuit configured to drive the third chopper output to the output voltage of the filter circuit is autozeroed. The RRL is disconnected from the low frequency signal path in response to activation of a Hold signal, the Hold signal indicating the non-linear operational event.

In another embodiment, an apparatus comprises a high frequency signal path configured to amplify an input signal to generate a first output. A low frequency signal path is configured to generate a second output, the low frequency signal path comprising a first chopper circuit configured to chop the input signal into a first chopper output, a first amplifier circuit configured to amplify the first chopper output into an amplifier output, and a second chopper circuit configured to chop the amplifier output into a second chopper output. A second amplifier circuit is configured to combine the first output with the second output to generate a system output. A Ripple Reduction Loop (RRL) comprises a third chopper circuit configured to chop the second chopper output to generate a third chopper output, a filter circuit configured to filter the third chopper output to generate a Direct Current (DC) offset correction, and a third amplifier circuit configured to combine the DC correction with the first amplifier output, wherein the third chopper output is driven to an output voltage of the filter circuit and the RRL is disconnected from the second signal path in response to a non-linear event.

Alternative embodiments of the apparatus include one of the following features, or any combination thereof. The RRL comprises a window comparator circuit configured to detect the non-linear event from a high slew rate determined by comparing a differential voltage comprising one of the input signal and the second chopper output. A switchable buffer circuit is coupled between the third chopper output and the filter output, the switchable buffer circuit comprising an autozero switch circuit with the switchable buffer circuit and configured to remove an offset of the switchable buffer circuit prior to driving the third chopper output to the voltage of the filter output. The filter circuit comprises a notch filter. The filter circuit comprises a low pass filter. A multiplexer circuit is configured to multiplex a plurality of inputs to form the input signal. The first amplifier circuit is a transconductance amplifier.

In another embodiment, a method for a fast settling ripple reduction loop for high speed precision chopper amplifiers comprises amplifying an input signal with a low frequency signal path to generate a first output, the low frequency signal path comprising chopping the input signal to generate a first chopper output, amplifying the first chopper output with an amplifier circuit to generate an amplifier output and chopping the amplified output to generate a second chopper output, the first output buffered from the second chopper output. An output ripple of the first output is reduced with a Ripple Reduction Loop (RRL) comprising chopping the second chopper output to generate a third chopper output, filtering the third chopper output with a filter circuit to generate a Direct Current (DC) offset correction, and combining the DC offset correction with the amplifier output, wherein the third chopper output is driven to an output voltage of the filter circuit and the RRL is disconnected from the low frequency signal path in response to an amplifier non-linear operational event, and the RRL comprises a lower bandwidth than a chopping frequency of a first chopper circuit.

Alternative embodiments of the method for a fast settling ripple reduction loop for high speed precision chopper amplifiers include one of the following features, or any combination thereof. Detecting the amplifier non-linear operational event comprises detecting a high input signal slew rate from signals exceeding a threshold, wherein pair of signals comprise one of the input signal and the second chopper output. A buffer circuit configured to drive the third chopper output to the output voltage of the filter circuit is autozeroed.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for a fast settling ripple reduction loop for high speed precision chopper amplifiers comprising:
    amplifying an input signal with a high frequency signal path to generate a first output;
    amplifying the input signal with a low frequency signal path to generate a second output, the low frequency signal path comprising chopping the input signal to generate a first chopper output, amplifying the first chopper output with an amplifier circuit to generate an amplifier output and chopping the amplified output to generate a second chopper output;
    combining the first output with the second output to generate a system output; and
    reducing an output ripple of the system output with a Ripple Reduction Loop (RRL) comprising chopping the second chopper output to generate a third chopper output, filtering the third chopper output with a filter circuit to generate a Direct Current (DC) offset correction, and combining the DC offset correction with the amplifier output,
    wherein the third chopper output is driven to an output voltage of the filter circuit and the RRL is disconnected from the low frequency signal path in response to a non-linear operational event, wherein disconnecting the RRL from the low frequency signal path is in response to activation of a Hold signal, the Hold signal indicating the non-linear operational event.

2. The method of claim 1 wherein a first chopper circuit modulates the input signal to generate the first chopper output comprising an Alternating Current (AC) signal, a second chopper circuit demodulates the amplifier output to generate a DC signal and the second chopper circuit modulates a DC offset of the amplifier output of the amplifier circuit to generate an AC amplifier offset.

3. The method of claim 1 further comprising multiplexing a plurality of inputs with a multiplexer circuit to form the input signal.

4. The method of claim 3 wherein detecting the non-linear operational event comprises detecting a transition of a multiplexer address of the multiplexer circuit, wherein the multiplexer address selects one of the plurality of inputs.

5. The method of claim 1 wherein detecting the non-linear operational event comprises detecting a high input signal slew rate from a differential voltage exceeding a threshold.

6. The method of claim 5 wherein the high input signal slew rate is determined from a pair of signals comprising one of the input signal and the second chopper output.

7. The method of claim 5 wherein detecting the slew rate comprises comparing the differential voltage with a window comparator circuit.

8. The method of claim 1 wherein the RRL comprises a lower bandwidth than a chopping frequency of a first chopper circuit which is configured to chop the input signal into the first chopper output.

9. The method of claim 1 further comprising autozeroing a buffer circuit configured to drive the third chopper output to the output voltage of the filter circuit.

10. An apparatus comprising:
    a high frequency signal path configured to amplify an input signal to generate a first output;
    a low frequency signal path configured to generate a second output, the low frequency signal path comprising a first chopper circuit configured to chop the input signal into a first chopper output, a first amplifier circuit configured to amplify the first chopper output into an amplifier output, and a second chopper circuit configured to chop the amplifier output into a second chopper output;
    a second amplifier circuit configured to combine the first output with the second output to generate a system output; and
    a Ripple Reduction Loop (RRL) comprising a third chopper circuit configured to chop the second chopper output to generate a third chopper output, a filter circuit configured to filter the third chopper output to generate a Direct Current (DC) correction, and a third amplifier circuit configured to combine the DC correction with the first amplifier output, wherein the third chopper output is driven to an output voltage of the filter circuit and the RRL is disconnected from the second signal path in response to a non-linear event, wherein the RRL comprises a window comparator circuit configured to detect the non-linear event from a high slew rate determined by comparing a differential voltage comprising one of the input signal and the second chopper output.

11. The apparatus of claim 10 comprising a switchable buffer circuit coupled between the third chopper output and the filter output, the switchable buffer circuit comprising a autozero switch circuit connected to the switchable buffer circuit and configured to remove an offset of the switchable buffer circuit prior to driving the third chopper output to the voltage of the filter output.

12. The apparatus of claim 10 wherein the filter circuit comprises a notch filter.

13. The apparatus of claim 10 wherein the filter circuit comprises a low pass filter.

14. The apparatus of claim 10 further comprising a multiplexer circuit configured to multiplex a plurality of inputs to form the input signal.

15. The apparatus of claim 10 wherein the first amplifier circuit is a transconductance amplifier.

16. A method for a fast settling ripple reduction loop for high speed precision chopper amplifiers comprising:
    amplifying an input signal with a low frequency signal path to generate a first output, the low frequency signal path comprising chopping the input signal to generate a first chopper output, amplifying the first chopper output with an amplifier circuit to generate an amplifier output and chopping the amplified output to generate a second chopper output, the first output buffered from the second chopper output; and
    reducing an output ripple of the first output with a Ripple Reduction Loop (RRL) comprising chopping the second chopper output to generate a third chopper output, filtering the third chopper output with a filter circuit to generate a Direct Current (DC) correction, and combining the DC correction with the amplifier output, wherein the third chopper output is driven to an output voltage of the filter circuit and the RRL is disconnected from the low frequency signal path in response to an amplifier non-linear operational event, and the RRL comprises a lower bandwidth than a chopping frequency of a first chopper, wherein detecting the amplifier non-linear operational event comprises detecting a high slew rate from a differential voltage exceeding a threshold, wherein the differential voltage is one of the input signal and the second chopper output.

17. The method of claim 16 further comprising autozeroing a buffer circuit configured to drive the third chopper output to the output voltage of the filter circuit.

* * * * *